United States Patent
Chen et al.

(10) Patent No.: US 10,497,756 B1
(45) Date of Patent: Dec. 3, 2019

(54) IMAGE-SENSING DISPLAY DEVICE AND IMAGE PROCESSING METHOD

(71) Applicant: Au Optronics Corporation, Hsinchu (TW)

(72) Inventors: Shin-Shueh Chen, Hsinchu County (TW); Pin-Miao Liu, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/502,050

(22) Filed: Jul. 3, 2019

Related U.S. Application Data

(60) Provisional application No. 62/717,260, filed on Aug. 10, 2018.

(30) Foreign Application Priority Data

Nov. 30, 2018 (TW) .............................. 107143146 A

(51) Int. Cl.
   *H01L 27/32* (2006.01)
   *H01L 25/16* (2006.01)
   (Continued)

(52) U.S. Cl.
   CPC .......... *H01L 27/3213* (2013.01); *G06F 3/041* (2013.01); *G06F 3/042* (2013.01);
   (Continued)

(58) Field of Classification Search
   CPC ... H01L 27/3213; H01L 27/30; H01L 27/323; H01L 27/3246; G06F 3/041; G06F 3/042
   See application file for complete search history.

(56) References Cited

U.S. PATENT DOCUMENTS

| 9,542,022 B2 * | 1/2017 | Kozuma | G06F 3/042 |
| 2013/0176283 A1 * | 7/2013 | Nakata | G06F 3/042 345/175 |

(Continued)

FOREIGN PATENT DOCUMENTS

| CN | 106653802 | 5/2017 |
| CN | 107527930 | 12/2017 |

(Continued)

*Primary Examiner* — Jose R Diaz

(74) *Attorney, Agent, or Firm* — JCIPRNET

(57) ABSTRACT

An image-sensing display device and an image processing method are provided. The image-sensing display device includes a substrate, banks, and sensor units. The banks and the sensor units are located on the substrate. Each of the sensor units includes first to fourth light-emitting devices and a photo sensor. The first to fourth light-emitting devices are located around a corresponding bank. The first to third light-emitting devices include a red light-emitting device, a green light-emitting device, and a blue light-emitting device. The first and fourth light-emitting devices are light-emitting devices of a same color. The photo sensor is located on the corresponding bank. The photo sensor includes a first electrode, a second electrode, and a sensing layer located between the first electrode and the second electrode. The first electrode and the second electrode respectively extend from the sensing layer along a first direction and a second direction.

13 Claims, 11 Drawing Sheets

(51) Int. Cl.
*G06F 3/041* (2006.01)
*G06F 3/042* (2006.01)
*H01L 27/30* (2006.01)

(52) U.S. Cl.
CPC ............ *H01L 25/167* (2013.01); *H01L 27/30* (2013.01); *H01L 27/323* (2013.01); *H01L 27/3246* (2013.01)

(56) References Cited

U.S. PATENT DOCUMENTS

2016/0322429 A1* 11/2016 Chen .................. G06F 3/044
2017/0365588 A1   12/2017 Chen

FOREIGN PATENT DOCUMENTS

| CN | 207381405 | 5/2018 |
| CN | 108242460 | 7/2018 |

* cited by examiner ing IMAGE-SENSING DISPLAY DEVICE AND
IMAGE PROCESSING METHOD

CROSS REFERENCE TO RELATED
APPLICATION

This application claims the priority benefits of U.S. provisional application Ser. No. 62/717,260, filed on Aug. 10, 2018, and Taiwan application serial no. 107143146, filed on Nov. 30, 2018. The entirety of each of the above-mentioned patent applications is hereby incorporated by reference herein and made a part of this specification.

BACKGROUND OF THE INVENTION

Field of the Invention

The disclosure relates to a display device, and more particularly, to an image-sensing display device and an image processing method.

Description of Related Art

Currently, many personal electronic products with fingerprint recognition devices have become available on the market. For example, to protect the privacy of the user, many smartphones are equipped with fingerprint recognition functions to prevent others from accessing the data in the smartphone without the user's consent. In some smartphones with fingerprint recognition functions, a photo sensor is used to receive the light reflected by the fingerprint to achieve the function of fingerprint recognition. In order to manufacture narrow-frame or frameless smartphones, many manufacturers are attempting to dispose the photo sensor in the display region of the screen. However, this would limit the area of the aperture region of the pixels in the display device disposed in the display region.

SUMMARY OF THE INVENTION

The invention provides an image-sensing display device that can improve the issue of the influence of a photo sensor on the aperture ratio of the pixels.

The invention provides an image processing method that can improve the issue of the influence of a photo sensor on the aperture ratio of the pixels.

At least one embodiment of the invention provides an image-sensing display device. The image-sensing display device includes a substrate, a plurality of banks, and a plurality of sensor units. The banks and the sensor units are located on the substrate. Each of the sensor units includes first to fourth light-emitting devices and a photo sensor. The first to fourth light-emitting devices are located around a corresponding bank. The first to third light-emitting devices include a red light-emitting device, a green light-emitting device, and a blue light-emitting device. The first light-emitting device and the fourth light-emitting device are light-emitting devices of a same color. The photo sensor is located on the corresponding bank. The photo sensor includes a first electrode, a second electrode, and a sensing layer located between the first electrode and the second electrode. The first electrode and the second electrode respectively extend from the sensing layer along a first direction and a second direction. The first direction is different from the second direction.

At least one embodiment of the invention provides an image processing method including the following steps. An image-sensing display device is provided. A sensed object is scanned. A plurality of signals generated by a photo sensor are computed. An image generated after the signals are computed is displayed. The image-sensing display device includes a substrate, a plurality of banks, and a plurality of sensor units. The banks and the sensor units are located on the substrate. Each of the sensor units includes first to fourth light-emitting devices and the photo sensor. The first to fourth light-emitting devices are located around a corresponding bank. The first to third light-emitting devices include a red light-emitting device, a green light-emitting device, and a blue light-emitting device. The first light-emitting device and the fourth light-emitting device are light-emitting devices of a same color. The photo sensor is located on the corresponding bank. The photo sensor includes a first electrode, a second electrode, and a sensing layer located between the first electrode and the second electrode. The first electrode and the second electrode respectively extend from the sensing layer along a first direction and a second direction. The first direction is different from the second direction. A method of scanning the sensed object includes the following steps. The photo sensor receives light of the first light-emitting device reflected by the sensed object. The photo sensor receives light of the second light-emitting device reflected by the sensed object. The photo sensor receives light of the third light-emitting device reflected by the sensed object. The photo sensor receives light of the fourth light-emitting device reflected by the sensed object.

Based on the above, the light emitted by the light-emitting device is reflected by the sensed object and received by the photo sensor. Since the photo sensor is located on the bank, the light emitted by the light-emitting device passes through fewer layers before reaching the sensing layer. Therefore, the photocurrent generated by the photo sensor can be better controlled and have better uniformity, and the issue of disuniform color or brightness (MURA) can be reduced. Moreover, forming the photo sensor on the bank not only reduces the influence on the aperture ratio of pixels, but also prevents the photo sensor from being affected by other processes performed before the photo sensor is formed.

To make the aforementioned more comprehensible, several embodiments accompanied with drawings are described in detail as follows.

DESCRIPTION OF THE EMBODIMENTS

Figure 1A:
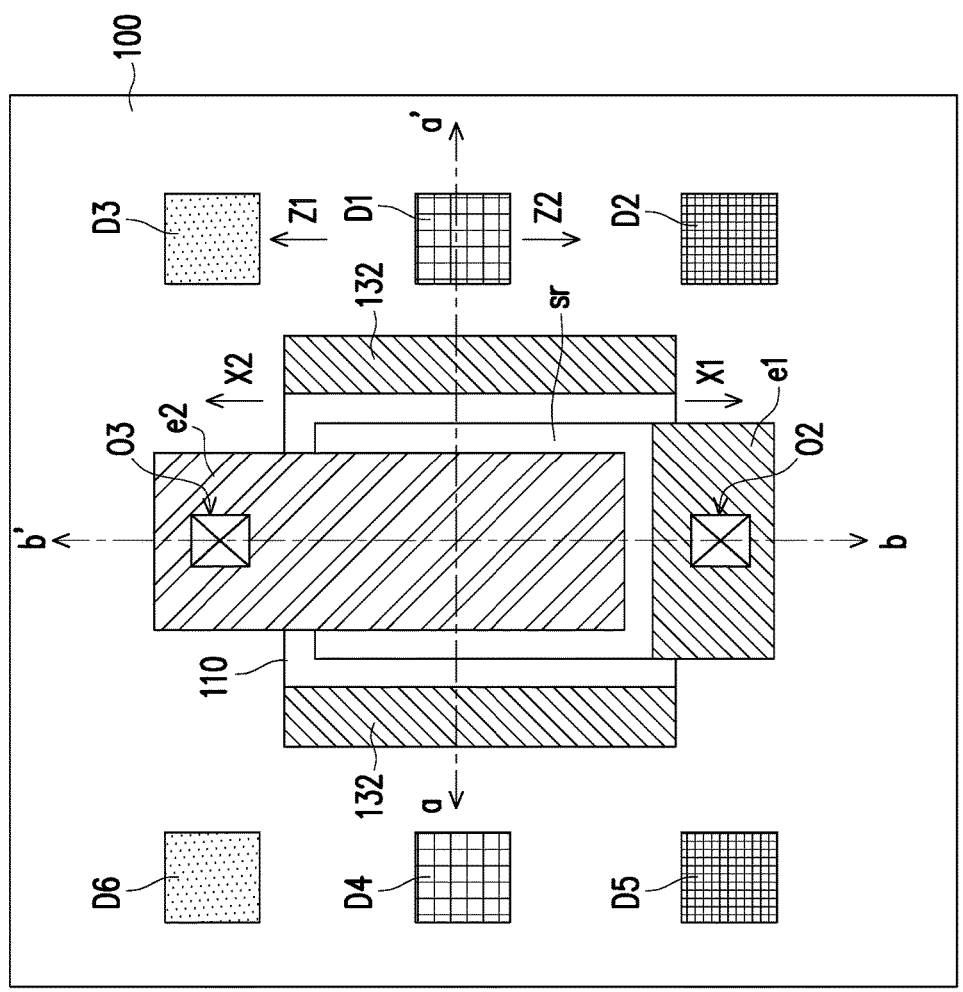
FIG. 1A is a schematic top view of an image-sensing display device according to an embodiment of the invention.
Figure 1B:
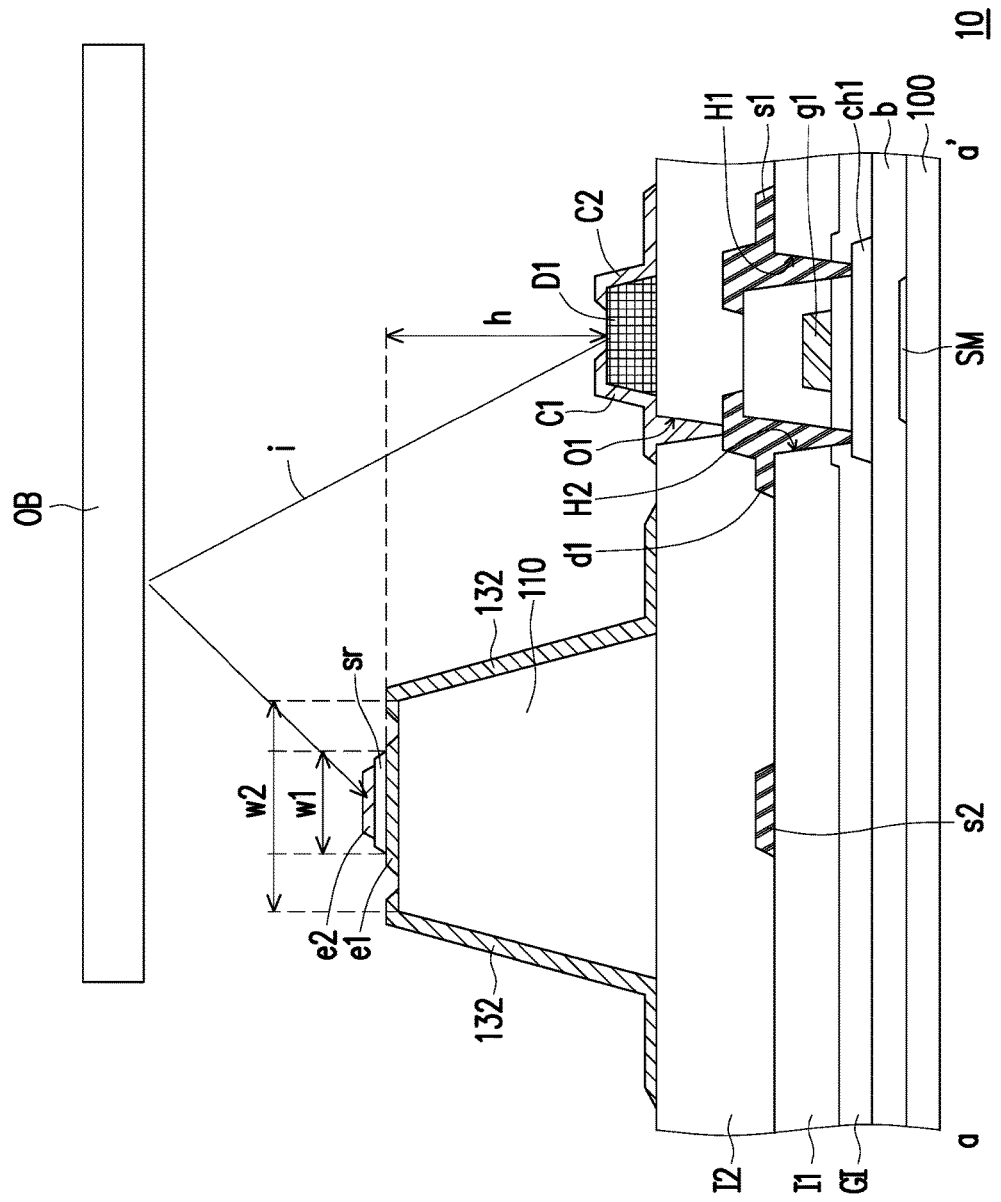
FIG. 1B is a schematic cross-sectional view taken along line aa' of FIG. 1A.
Figure 1C:
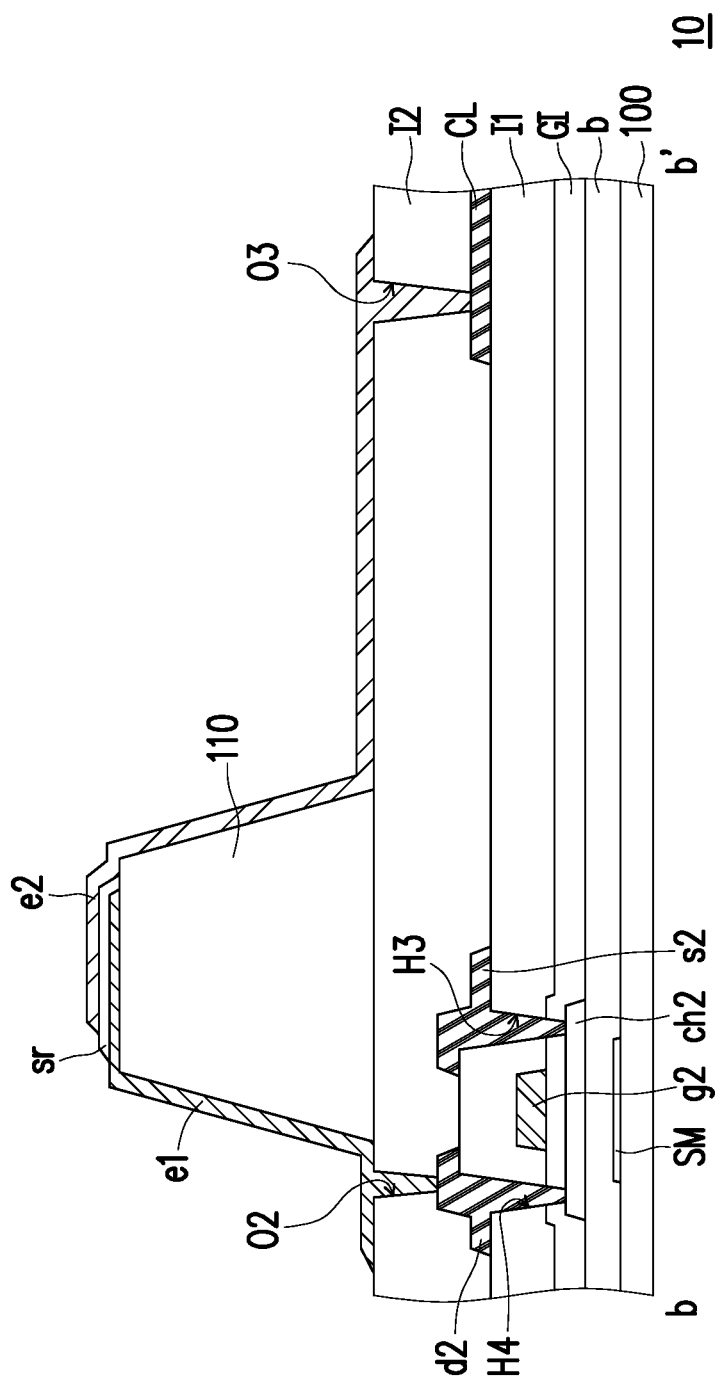
FIG. 1C is a schematic cross-sectional view taken along line bb' of FIG. 1A.

FIG. 1A is a schematic top view of an image-sensing display device according to an embodiment of the invention. FIG. 1B is a schematic cross-sectional view taken along line aa' of FIG. 1A. FIG. 1C is a schematic cross-sectional view taken along line bb' of FIG. 1A.

Referring to FIG. 1A and FIG. 1B, an image-sensing display device 10 includes a substrate 100, a plurality of banks 110, and a plurality of sensor units 120. For convenience of description, FIG. 1A shows one bank 110 and one sensor unit 120 as an example. The bank 110 and the sensor unit 120 are located on the substrate 100. The sensor unit 120 includes a first light-emitting device D1, a second light-emitting device D2, a third light-emitting device D3, a fourth light-emitting device D4, and a photo sensor L, and the first light-emitting device D1, the second light-emitting device D2, the third light-emitting device D3, and the fourth light-emitting device D4 are located around the corresponding bank 110. In the present embodiment, the sensor unit 120 includes a first light-emitting device D1, a second light-emitting device D2, a third light-emitting device D3, a fourth light-emitting device D4, a fifth light-emitting device D5, a sixth light-emitting device D6, and a photo sensor L. The first light-emitting device D1, the second light-emitting device D2, the third light-emitting device D3, the fourth light-emitting device D4, the fifth light-emitting device D5, and the sixth light-emitting device D6 are located around the corresponding bank 110. In the present embodiment, the first light-emitting device D1, the second light-emitting device D2, the third light-emitting device D3, the fourth light-emitting device D4, the fifth light-emitting device D5, and the sixth light-emitting device D6 are micro LEDs.

The first light-emitting device D1 and the fourth light-emitting device D4 are light-emitting devices of the same color. The second light-emitting device D2 and the fifth light-emitting device D5 are light-emitting devices of the same color. The third light-emitting device D3 and the sixth light-emitting device D6 are light-emitting devices of the same color. The first to third light-emitting devices D1 to D3 include a red light-emitting device, a green light-emitting device, and a blue light-emitting device. In the present embodiment, the first light-emitting device D1 and the fourth light-emitting device D4 of the same color are located on two opposite sides of the bank 110, the second light-emitting device D2 and the fifth light-emitting device D5 of the same color are located on two opposite sides of the bank 110, and the third light-emitting device D3 and the sixth light-emitting device D6 of the same color are located on two opposite sides of the bank 110.

In the present embodiment, the first light-emitting device D1, the second light-emitting device D2, the third light-emitting device D3, the fourth light-emitting device D4, the fifth light-emitting device D5, and the sixth light-emitting device D6 all have similar structures except for the color. Therefore, FIG. 1B shows the first light-emitting device D1 as an example for description.

The first light-emitting device D1, the second light-emitting device D2, the third light-emitting device D3, the fourth light-emitting device D4, the fifth light-emitting device D5, and the sixth light-emitting device D6 are located around the corresponding bank 110. The first light-emitting device D1, the second light-emitting device D2, the third light-emitting device D3, the fourth light-emitting device D4, the fifth light-emitting device D5, and the sixth light-emitting device D6 are respectively electrically connected to corresponding switch devices T. In the present embodiment, the first light-emitting device D1, the second light-emitting device D2, the third light-emitting device D3, the fourth light-emitting device D4, the fifth light-emitting device D5, and the sixth light-emitting device D6 may be respectively driven through different switch devices T.

FIG. 1B shows the switch device T corresponding to the first light-emitting device D1. Since the switch devices T respectively corresponding to the first light-emitting device D1, the second light-emitting device D2, the third light-emitting device D3, the fourth light-emitting device D4, the fifth light-emitting device D5, and the sixth light-emitting device D6 have similar structures, only the switch device T corresponding to the first light-emitting device D1 will be described as an example.

The switch device T includes a gate g1, a channel layer ch1, a source s1, and a drain d1. The channel layer ch1 is located on the substrate 100.

In the present embodiment, a light shielding layer SM is further sandwiched between the channel layer ch1 and the substrate 100, and a buffer layer b is sandwiched between the light shielding layer SM and the channel layer ch1. The gate g1 is electrically connected to a scan line (not shown). The gate g1 overlaps with the channel layer ch1, and a gate insulating layer GI is sandwiched between the gate g1 and the channel layer ch1. A first insulating layer I1 covers the gate g1. The source s1 and the drain d1 are located on the first insulating layer I1 and are respectively electrically connected to the channel layer ch1 via openings H1 and H2. The openings H1 and H2 penetrate through at least the first insulating layer I1. In the present embodiment, the openings H1 and H2 penetrate through the gate insulating layer GI and the first insulating layer I1.

Although the switch device T is a top gate-type thin-film transistor in the present embodiment as an example, the invention is not limited thereto. In other embodiments, the switch device T may also be a bottom gate-type or another type of thin-film transistor.

A second insulating layer I2 covers the switch device T. The first light-emitting device D1, the second light-emitting device D2, the third light-emitting device D3, the fourth light-emitting device D4, the fifth light-emitting device D5, the sixth light-emitting device D6, and the bank 110 are located on the second insulating layer I2.

In the present embodiment, the first light-emitting device D1, the second light-emitting device D2, the third light-emitting device D3, the fourth light-emitting device D4, the fifth light-emitting device D5, and the sixth light-emitting device D6 are horizontal light-emitting devices. Taking the first light-emitting device D1 as an example, the first light-emitting device D1 is connected to a first connection structure C1 and a second connection structure C2. The first connection structure C1 and the second connection structure C2 are both connected to the upper side of the first light-emitting device D1. The first connection structure C1 is located in an opening O1 of the second insulating layer I2 and electrically connects the first light-emitting device D1 and the drain d1 of the switch device T.

In the present embodiment, the first light-emitting device D1, the second light-emitting device D2, the third light-emitting device D3, the fourth light-emitting device D4, the fifth light-emitting device D5, and the sixth light-emitting device D6 are respectively electrically connected to the different switch devices T via different first connection structures C1. The first light-emitting device D1, the second light-emitting device D2, the third light-emitting device D3, the fourth light-emitting device D4, the fifth light-emitting device D5, and the sixth light-emitting device D6 may be optionally electrically connected to each other via the second connection structure C2, but the invention is not limited thereto.

The photo sensor L is located on the corresponding bank 110. The photo sensor L includes a first electrode e1, a second electrode e2, and a sensing layer sr located between the first electrode e1 and the second electrode e2. A width w1 of the sensing layer sr is smaller than a width w2 of the top surface of the corresponding bank 110.

The first electrode e1 and the second electrode e2 respectively extend from the sensing layer sr along a first direction X1 and a second direction X2. The first direction X1 is different from the second direction X2. For example, an included angle between the first direction X1 and the second direction X2 may be 90 degrees, 180 degrees, or another angle. In other embodiments, the sensing layer sr and the first electrode e1 have the same pattern. In other words, the patterns of the sensing layer sr and the first electrode e1 may be defined by the same mask to thereby save the number of masks required for the process, but the invention is not limited thereto.

In the present embodiment, the image-sensing display device 10 further includes a first reflection layer 132. The first reflection layer 132 is located on the corresponding bank 110, and the first reflection layer 132 is separated from the first electrode e1 and the second electrode e2 to thereby prevent the first reflection layer 132 from affecting the signal generated by the photo sensor L. In the present embodiment, the first reflection layer 132 and the first electrode e1 belong to the same patterned conductive layer to thereby reduce the number of masks required for the process.

Referring to FIG. 1A and FIG. 1C, the sensor unit 120 further includes an active device A. In the present embodiment, the active device A is located below the corresponding bank 110. Therefore, the first light-emitting device D1, the second light-emitting device D2, the third light-emitting device D3, the fourth light-emitting device D4, the fifth light-emitting device D5, and the sixth light-emitting device D6 may be spaced apart at a smaller interval and may be arranged more symmetrically to improve the space utilization rate.

The active device A includes a gate g2, a channel layer ch2, a source s2, and a drain d2. The channel layer ch2 is located on the substrate 100.

In the present embodiment, the light shielding layer SM is further sandwiched between the channel layer ch2 and the substrate 100, and the buffer layer b is sandwiched between the light shielding layer SM and the channel layer ch2. The gate g2 overlaps with the channel layer ch2, and the gate insulating layer GI is sandwiched between the gate g2 and the channel layer ch2. The first insulating layer I1 covers the gate g2. The source s2 and the drain d2 are located on the first insulating layer I1 and are respectively electrically connected to the channel layer ch2 via openings H3 and H4. The openings H3 and H4 penetrate through at least the first insulating layer I1. In the present embodiment, the openings H3 and H4 penetrate through the gate insulating layer GI and the first insulating layer I1.

Although the active device A is a top gate-type thin-film transistor in the present embodiment as an example, the invention is not limited thereto. In other embodiments, the active device A may also be a bottom gate-type or another type of thin-film transistor.

The first electrode e1 of the photo sensor L is located in an opening O2 of the second insulating layer I2 and is electrically connected to the drain d2 of the active device A. The second electrode e2 of the photo sensor L is located in an opening O3 of the second insulating layer I2 and is electrically connected to a signal line CL.

In the present embodiment, the second electrode e2 of the photo sensor L, the first connection structure C1, and the second connection structure C2 belong to the same patterned conductive layer to thereby reduce the number of masks required for the process.

In the present embodiment, the position of the sensing layer sr of the photo sensor L is higher than the positions of the first light-emitting device D1, the second light-emitting device D2, the third light-emitting device D3, the fourth light-emitting device D4, the fifth light-emitting device D5, and the sixth light-emitting device D6, and a height difference h is in a range from 1 micrometer to 25 micrometers.

A light i emitted by the first light-emitting device D1 is reflected by a sensed object OB and is received by the sensing layer sr of the photo sensor L. Since the photo sensor L is located on the bank 110, the light i emitted by the first light-emitting device D1 passes through fewer layers before reaching the sensing layer sr (at least not passing through the layers between the substrate 100 and the bank 110). Therefore, the photocurrent generated by the photo sensor L can be better controlled and have better uniformity, and the issue of disuniform color or brightness (MURA) can be reduced.

Moreover, forming the photo sensor L on the bank 110 not only reduces the influence on the aperture ratio of pixels, but also prevents the photo sensor L from being affected by other processes performed before the photo sensor L is formed (e.g., the processes for forming the switch device T and the active device A).

Figure 2:
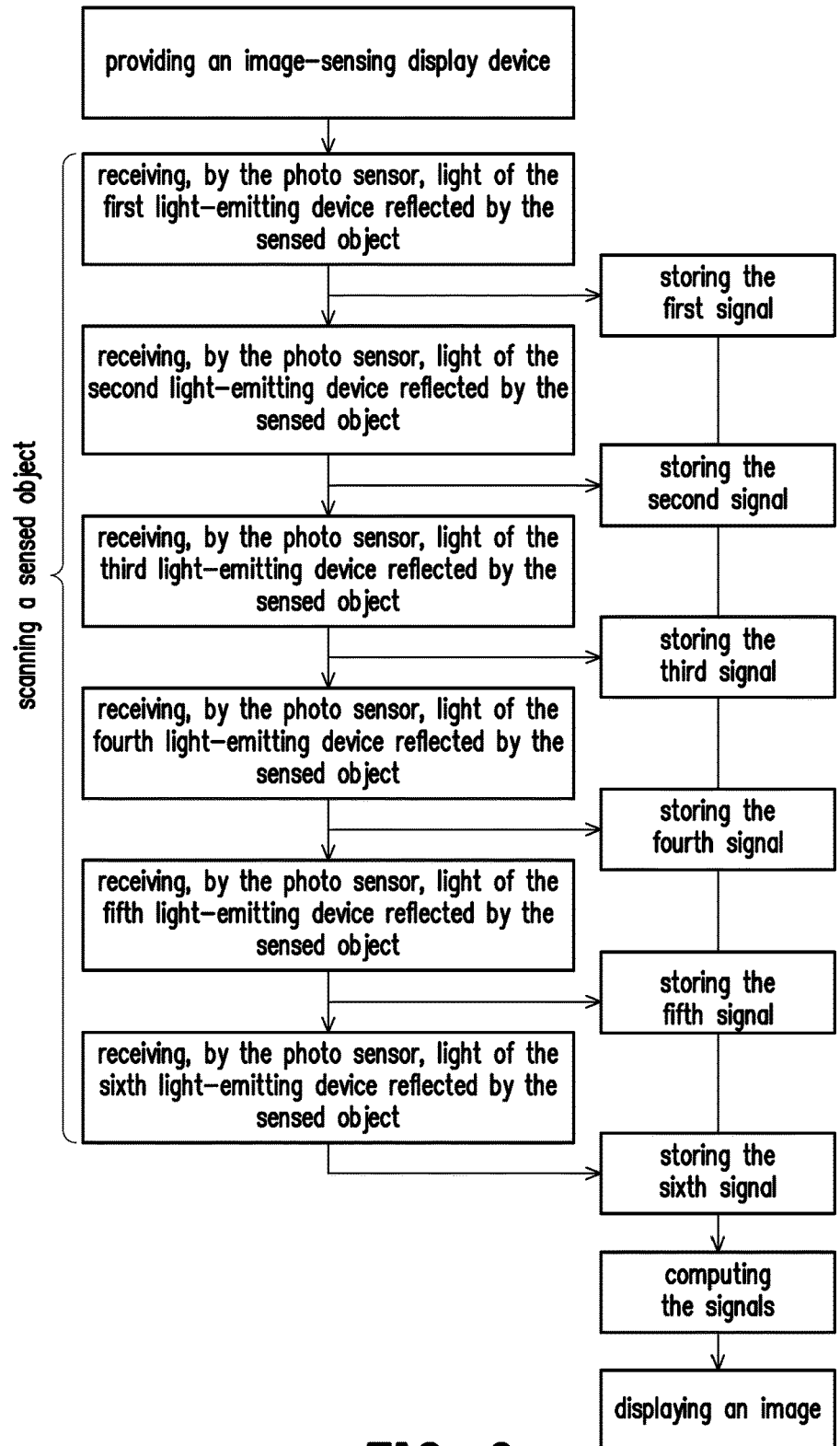
FIG. 2 is a flowchart of an image processing method according to an embodiment of the invention.

FIG. 2 is a flowchart of an image processing method according to an embodiment of the invention.

Referring to FIG. 2 and FIG. 1A to FIG. 1C, the image processing method includes providing the image-sensing display device 10, scanning a sensed object OB, computing a signal, and displaying an image.

The method of scanning the sensed object OB includes turning on the first light-emitting device D1, the second light-emitting device D2, the third light-emitting device D3, the fourth light-emitting device D4, the fifth light-emitting device D5, and the sixth light-emitting device D6 at different times, so that the photo sensor L respectively receives the light of the first light-emitting device D1, the second light-emitting device D2, the third light-emitting device D3, the fourth light-emitting device D4, the fifth light-emitting device D5, and the sixth light-emitting device D6 reflected by the sensed object OB.

For example, the method of scanning the sensed object OB includes the following steps. The first light-emitting device D1 is turned on, and the photo sensor L receives the light of the first light-emitting device D1 reflected by the sensed object OB and generates a first signal. The first signal is stored. The first light-emitting device D1 is turned off. The second light-emitting device D2 is turned on, and the photo sensor L receives the light of the second light-emitting device D2 reflected by the sensed object OB and generates a second signal. The second signal is stored. The second light-emitting device D2 is turned off. The third light-emitting device D3 is turned on, and the photo sensor L receives the light of the third light-emitting device D3 reflected by the sensed object OB and generates a third signal. The third signal is stored. The third light-emitting device D3 is turned off. The fourth light-emitting device D4 is turned on, and the photo sensor L receives the light of the fourth light-emitting device D4 reflected by the sensed object OB and generates a fourth signal. The fourth signal is stored. The fourth light-emitting device D4 is turned off. The fifth light-emitting device D5 is turned on, and the photo sensor L receives the light of the fifth light-emitting device D5 reflected by the sensed object OB and generates a fifth signal. The fifth signal is stored. The fifth light-emitting device D5 is turned off. The sixth light-emitting device D6 is turned on, and the photo sensor L receives the light of the sixth light-emitting device D6 reflected by the sensed object OB and generates a sixth signal. The sixth signal is stored. The sixth light-emitting device D6 is turned off.

After the sensed object OB is scanned, the signal is computed. For example, the first to sixth signals generated by the photo sensor L are computed. After the signal is computed, an image generated after the signal is computed is displayed, e.g., displaying an image of the sensed object OB. In some embodiments, the first light-emitting device D1, the second light-emitting device D2, the third light-emitting device D3, the fourth light-emitting device D4, the fifth light-emitting device D5, and the sixth light-emitting device D6 are located in a display region. When the image is displayed, a part of the first light-emitting device D1, the second light-emitting device D2, the third light-emitting device D3, the fourth light-emitting device D4, the fifth light-emitting device D5, and the sixth light-emitting device D6 is turned on, and the light-emitting devices that are actually turned on depend on the shape and color of the image. In other words, in some embodiments, in addition to being used to scan the image of the sensed object OB, the first light-emitting device D1, the second light-emitting device D2, the third light-emitting device D3, the fourth light-emitting device D4, the fifth light-emitting device D5, and the sixth light-emitting device D6 may also be used to display the image of the sensed object OB.

In the present embodiment, the first light-emitting device D1, the second light-emitting device D2, the third light-emitting device D3, the fourth light-emitting device D4, the fifth light-emitting device D5, and the sixth light-emitting device D6 include red light-emitting devices, green light-emitting devices, and blue light-emitting devices. In the present embodiment, when the sensed object OB is scanned, the light-emitting devices of different colors are turned on at different times. Therefore, the image-sensing display device 10 has a full-color scanning function.

In the present embodiment, the light-emitting devices of the same color are located at different positions. For example, the first light-emitting device D1 and the fourth light-emitting device D4 are respectively located on two sides of the photo sensor L, the second light-emitting device D2 and the fifth light-emitting device D5 are respectively located on two sides of the photo sensor L, and the third light-emitting device D3 and the sixth light-emitting device D6 are respectively located on two sides of the photo sensor L. Therefore, the light emitted by the light-emitting devices of the same color is reflected by the sensed object OB at different incident angles, so that a clearer image can be scanned.

In some embodiments, when the sensed object OB is scanned, the first light-emitting device D1, the second light-emitting device D2, the third light-emitting device D3, the fourth light-emitting device D4, the fifth light-emitting device D5, and the sixth light-emitting device D6 are respectively driven at a frequency f1. When the image generated after the signal (e.g., the first to the sixth signals) is computed is displayed, at least a part of the first light-emitting device D1, the second light-emitting device D2, the third light-emitting device D3, the fourth light-emitting device D4, the fifth light-emitting device D5, and the sixth light-emitting device D6 is driven at a frequency f2, and the frequency f1 is greater than or equal to the frequency C. Scanning at the higher frequency f1 can reduce the time required for scanning, and displaying the image at the lower frequency C can save the power required.

In some embodiments, when the sensed object OB is scanned, the light-emitting devices of the same color are turned on at the same time. For example, the method of scanning the sensed object OB includes the following steps. The first light-emitting device D1 and the fourth light-emitting device D4 are turned on at the same time, and the photo sensor L receives the light of the first light-emitting device D1 and the fourth light-emitting device D4 reflected by the sensed object OB and generates a first signal. The first signal is stored. The first light-emitting device D1 and the fourth light-emitting device D4 are turned off. The second light-emitting device D2 and the fifth light-emitting device D5 are turned on at the same time, and the photo sensor L receives the light of the second light-emitting device D2 and the fifth light-emitting device D5 reflected by the sensed object OB and generates a second signal. The second signal is stored. The second light-emitting device D2 and the fifth light-emitting device D5 are turned off. The third light-emitting device D3 and the sixth light-emitting device D6 are turned on at the same time, and the photo sensor L receives the light of the third light-emitting device D3 and the sixth light-emitting device D6 reflected by the sensed object OB and generates a third signal. The third signal is stored. The third light-emitting device D3 and the sixth light-emitting device D6 are turned off.

Turning on two light-emitting devices at a time can further reduce the time required for scanning.

Figure 3A:
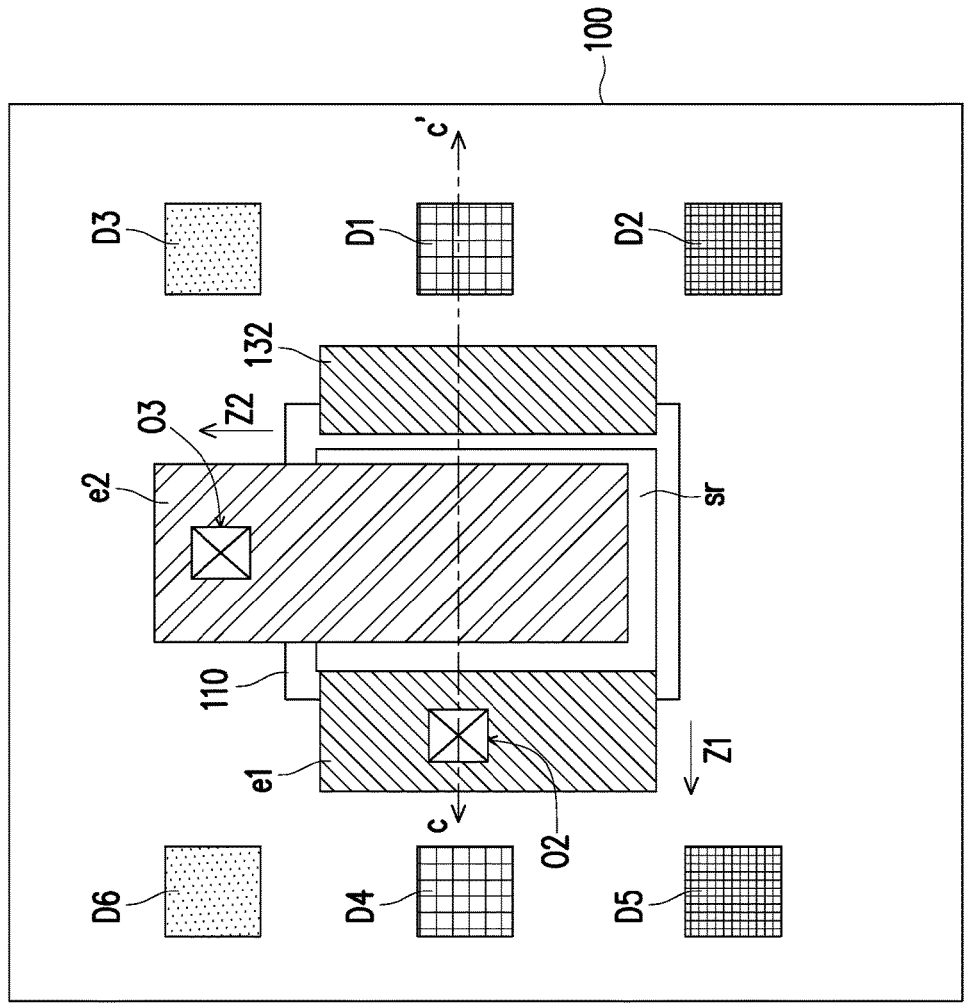
FIG. 3A is a schematic top view of an image-sensing display device according to an embodiment of the invention.
Figure 3B:
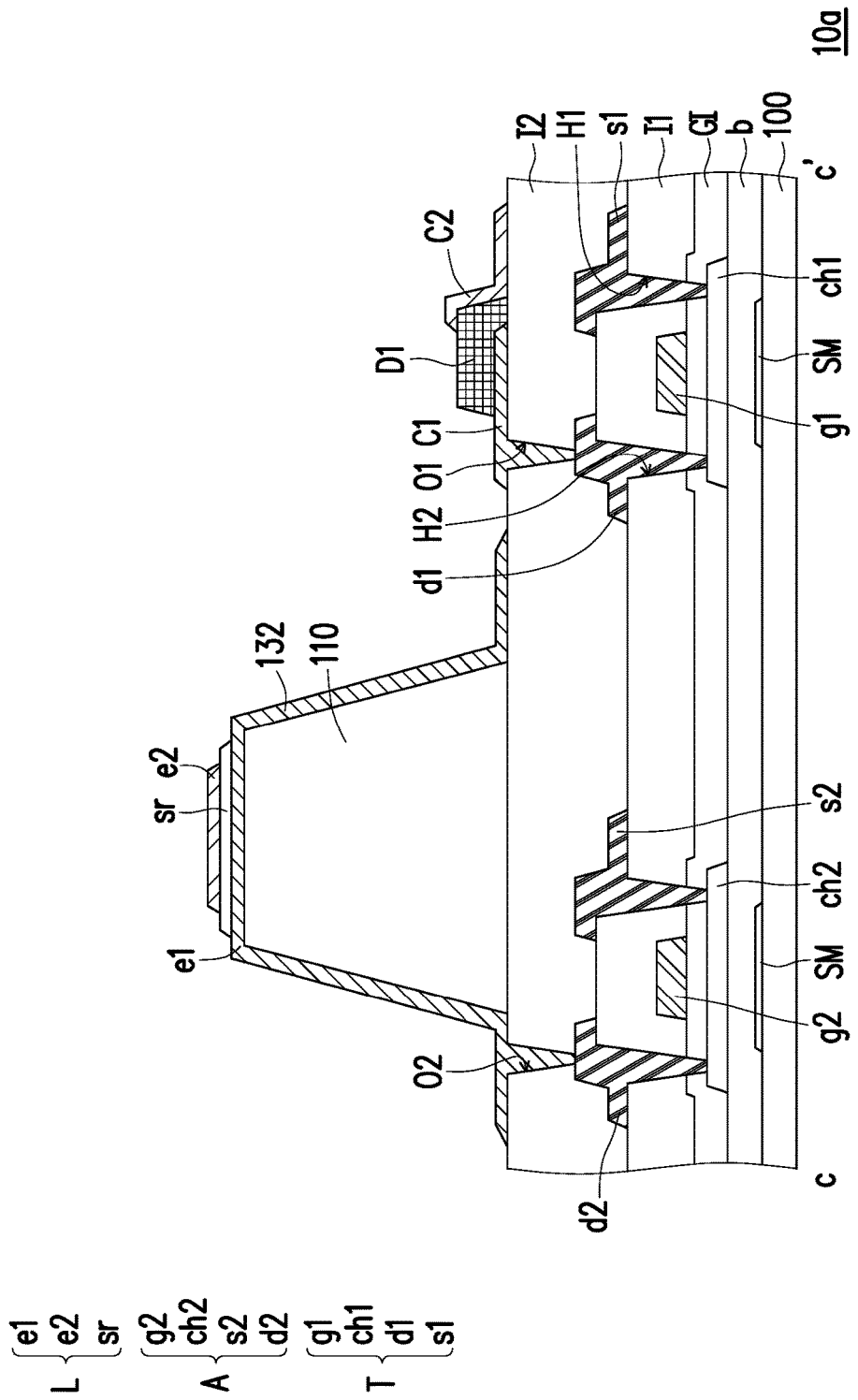
FIG. 3B is a schematic cross-sectional view taken along line cc' of FIG. 3A.

FIG. 3A is a schematic top view of an image-sensing display device according to an embodiment of the invention. FIG. 3B is a schematic cross-sectional view taken along line cc' of FIG. 3A.

It is noted here that the element numerals and part of the content of the embodiment of FIG. 1A to FIG. 1C apply to the embodiment of FIG. 3A and FIG. 3B, in which the same or similar numerals are used to represent the same or similar elements, and the description of the same technical content is omitted. Reference may be made to the foregoing embodiment for the description of the omitted part, which shall not be repeatedly described herein.

The main difference between an image-sensing display device 10a of FIG. 3A and the image-sensing display device 10 of FIG. 1A lies in that, in the image-sensing display device 10, the first electrode e1 and the second electrode e2 respectively extend from the sensing layer sr along the first direction X1 and the second direction X2 which are opposite to each other, while in the image-sensing display device 10a, the first electrode e1 and the second electrode e2 respectively extend from the sensing layer sr along the first direction X1 and the second direction X2 which are orthogonal to each other.

Referring to FIG. 3A and FIG. 3B, in the present embodiment, the first electrode e1 is connected to the first reflection layer 132, but the invention is not limited thereto. In other embodiments, the first electrode e1 is separated from the first reflection layer 132.

In the present embodiment, the first light-emitting device D1, the second light-emitting device D2, the third light-emitting device D3, the fourth light-emitting device D4, the fifth light-emitting device D5, and the sixth light-emitting device D6 are vertical light-emitting devices. Taking the first light-emitting device D1 as an example, the first light-emitting device D1 is connected to the first connection structure C1 and the second connection structure C2, and the first connection structure C1 and the second connection structure C2 are respectively connected to the lower side and the upper side of the first light-emitting device D1. In the present embodiment, the first electrode e1, the first reflection layer 132, and the first connection structure C1 belong to the same patterned conductive layer. In some embodiments, the first connection structure C1 is a metal, and the second connection structure C2 is a transparent conductive material to thereby improve the utilization rate of the light.

Figure 4:
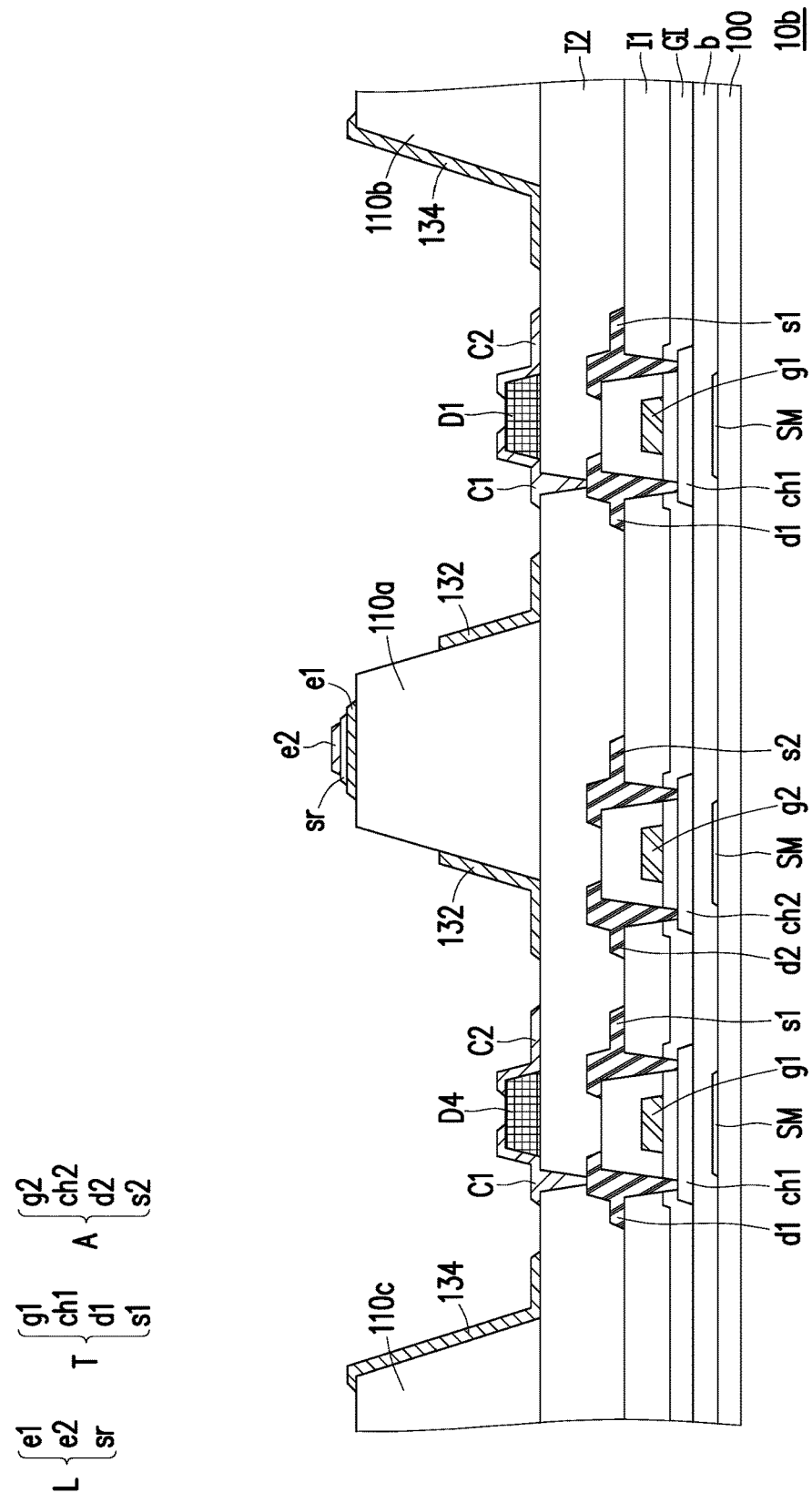
FIG. 4 is a schematic cross-sectional view of an image-sensing display device according to an embodiment of the invention.

FIG. 4 is a schematic cross-sectional view of an image-sensing display device according to an embodiment of the invention.

It is noted here that the element numerals and part of the content of the embodiment of FIG. 1A to FIG. 1C apply to the embodiment of FIG. 4, in which the same or similar numerals are used to represent the same or similar elements, and the description of the same technical content is omitted. Reference may be made to the foregoing embodiment for the description of the omitted part, which shall not be repeatedly described herein.

Referring to FIG. 4, the photo sensor L of an image-sensing display device 10b is located on a corresponding bank 110a, and banks 110b and 110c are adjacent to the bank 110a. In the present embodiment, the first light-emitting device D1 is located between the bank 110a and the bank 110b, and the fourth light-emitting device D4 is located between the bank 110a and the bank 110c.

The first reflection layer 132 is located on the bank 110a, and a second reflection layer 134 is located on the banks 110b and 110c. Compared to the second reflection layer 134, the first reflection layer 132 is closer to the photo sensor L, and the height of the first reflection layer 132 is smaller than the height of the second reflection layer 134. Therefore, the first reflection layer 132 is less likely to interfere with the photo sensor L, and the first reflection layer 132 and the second reflection layer 134 can further concentrate the light emitted by the light-emitting devices to increase the utilization rate of the light.

Figure 5:
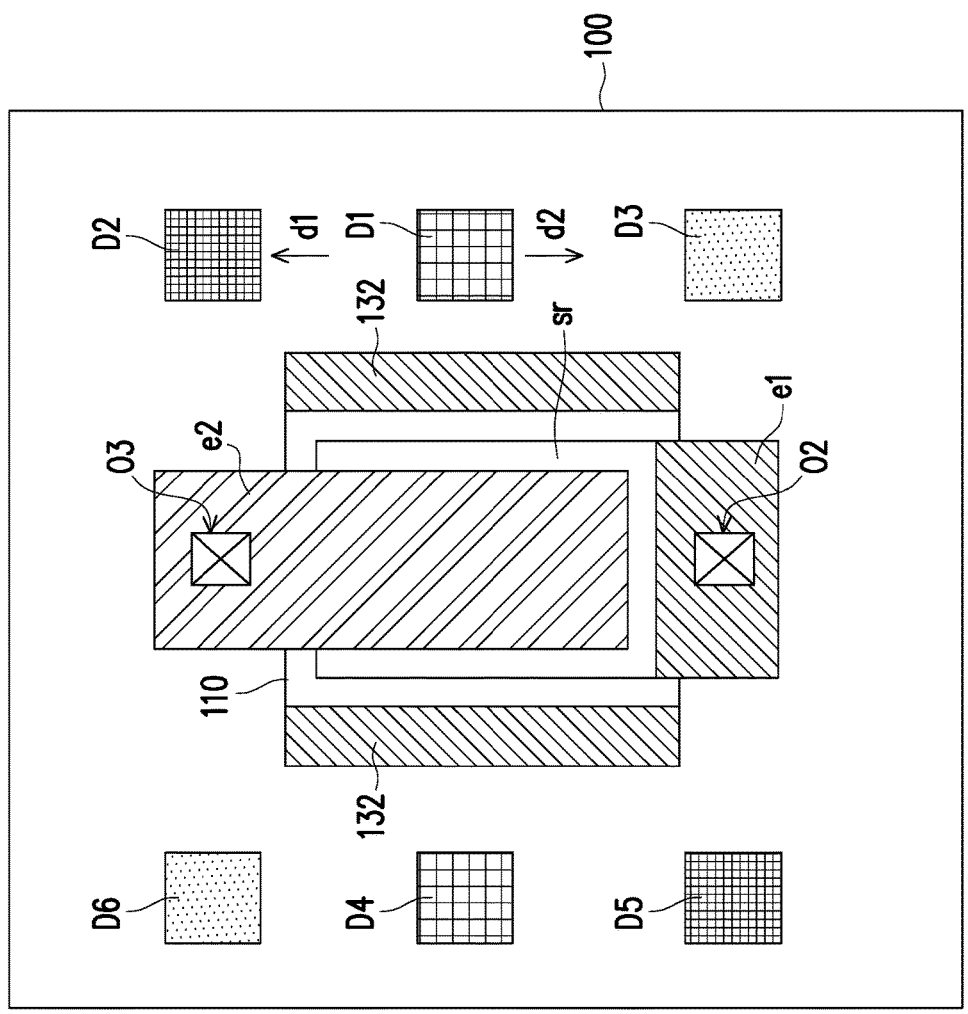
FIG. 5 is a schematic top view of an image-sensing display device according to an embodiment of the invention.

FIG. 5 is a schematic top view of an image-sensing display device according to an embodiment of the invention.

It is noted here that the element numerals and part of the content of the embodiment of FIG. 1A to FIG. 1C apply to the embodiment of FIG. 5, in which the same or similar numerals are used to represent the same or similar elements, and the description of the same technical content is omitted. Reference may be made to the foregoing embodiment for the description of the omitted part, which shall not be repeatedly described herein.

The main difference between an image-sensing display device 10c of FIG. 5 and the image-sensing display device 10 of FIG. 1A lies in that the arrangement positions of the second light-emitting device D2 and the third light-emitting device D3 in the image-sensing display device 10 are different from the arrangement positions of the second light-emitting device D2 and the third light-emitting device D3 in the image-sensing display device 10c.

In the embodiment of FIG. 1A, the second light-emitting device D2 is located in the second direction Z2 of the first light-emitting device D1, and the third light-emitting device D3 is located in the first direction Z1 of the first light-emitting device D1. In the embodiment of FIG. 5, the second light-emitting device D2 is located in the first direction d1 of the first light-emitting device D1, and the third light-emitting device D3 is located in the second direction d2 of the first light-emitting device D1.

Figure 6:
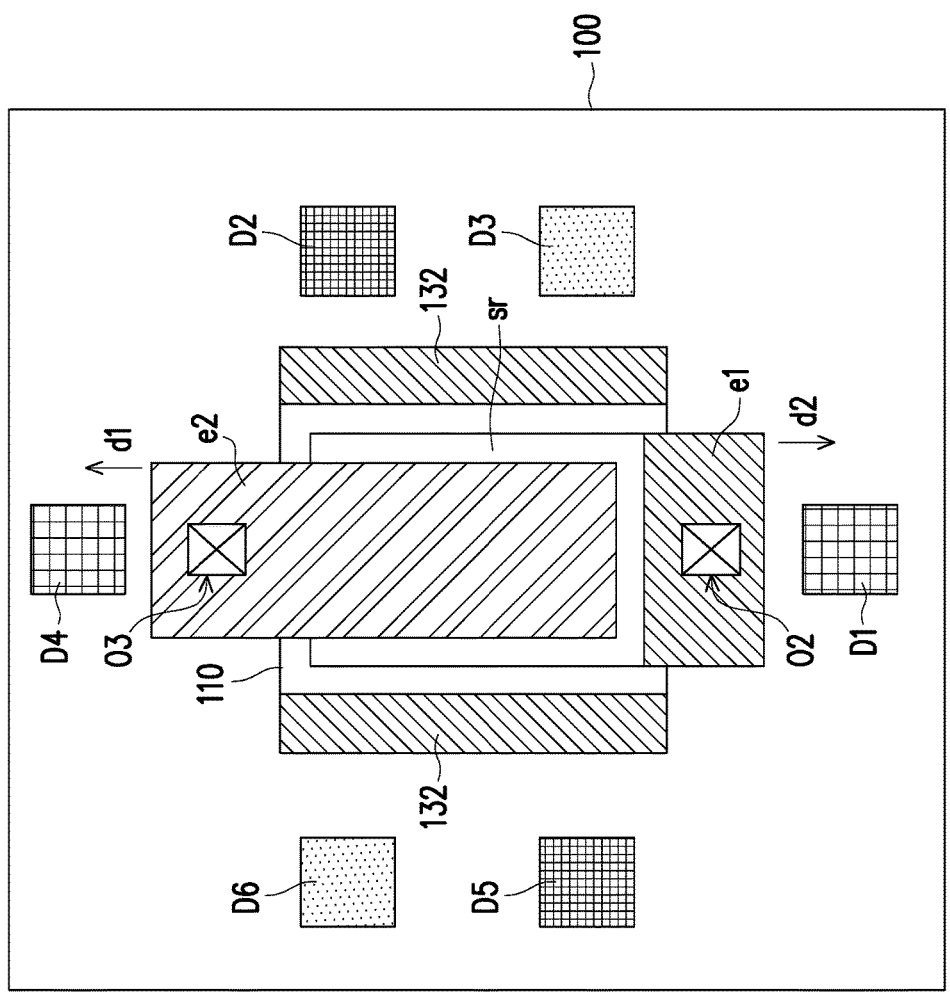
FIG. 6 is a schematic top view of an image-sensing display device according to an embodiment of the invention.

FIG. 6 is a schematic top view of an image-sensing display device according to an embodiment of the invention.

It is noted here that the element numerals and part of the content of the embodiment of FIG. 5 apply to the embodiment of FIG. 6, in which the same or similar numerals are used to represent the same or similar elements, and the description of the same technical content is omitted. Reference may be made to the foregoing embodiment for the description of the omitted part, which shall not be repeatedly described herein.

The main difference between an image-sensing display device 10d of FIG. 6 and the image-sensing display device 10c of FIG. 5 lies in that the arrangement positions of the first light-emitting device D1 and the fourth light-emitting device D4 in the image-sensing display device 10c are different from the arrangement positions of the first light-emitting device D1 and the fourth light-emitting device D4 in the image-sensing display device 10d.

In the embodiment of FIG. 6, the first light-emitting device D1 is located in the second direction d2 of the bank 110, and the fourth light-emitting device D4 is located in the first direction d1 of the bank 110.

Although FIG. 1A, FIG. 5, and FIG. 6 have shown three possibilities of the arrangement positions of the first light-emitting device D1, the second light-emitting device D2, the third light-emitting device D3, the fourth light-emitting device D4, the fifth light-emitting device D5, and the sixth light-emitting device D6, the invention is not limited thereto. The first light-emitting device D1, the second light-emitting device D2, the third light-emitting device D3, the fourth light-emitting device D4, the fifth light-emitting device D5, and the sixth light-emitting device D6 may also be arranged in other manners.

Figure 7:
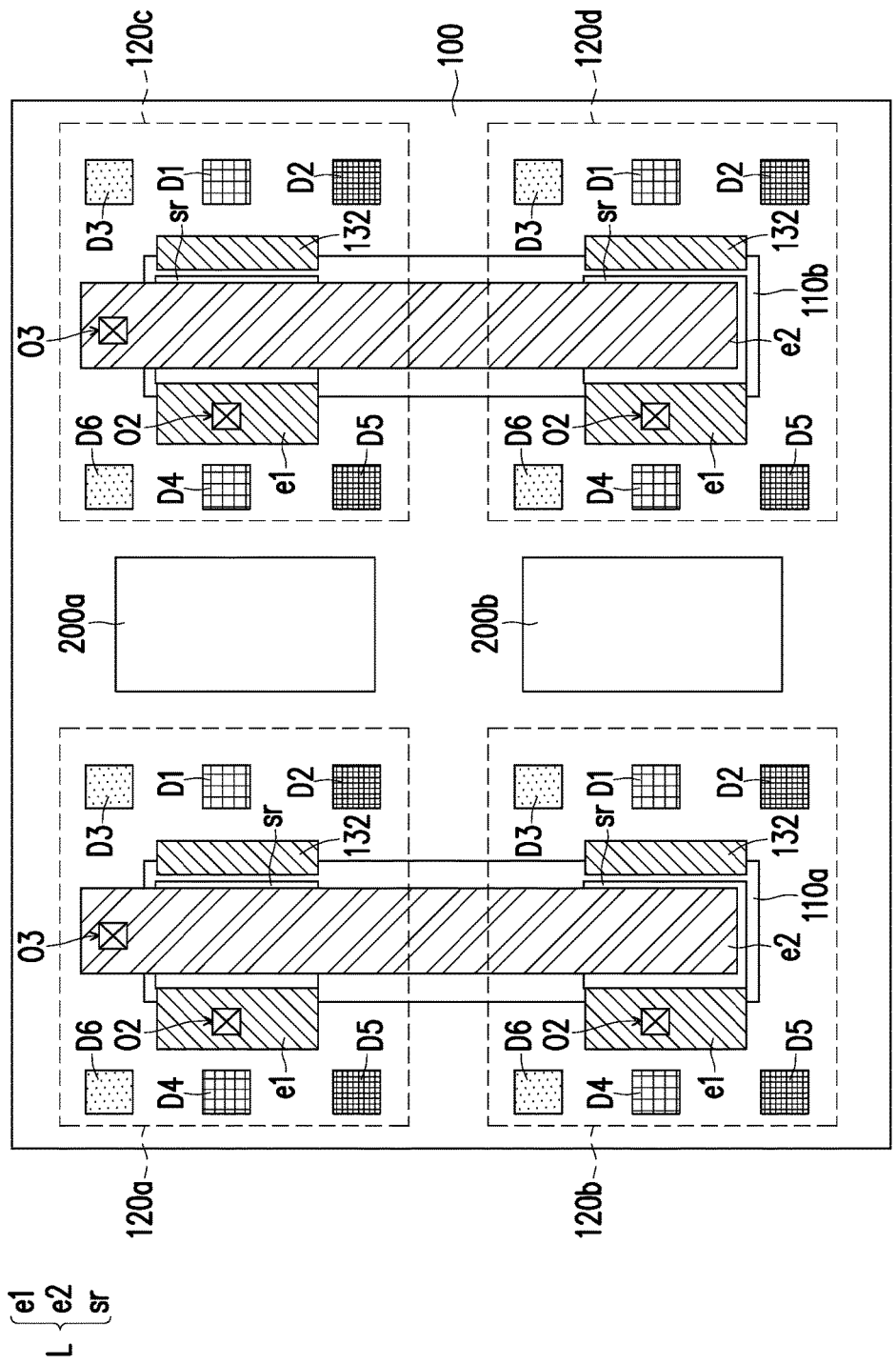
FIG. 7 is a schematic top view of an image-sensing display device according to an embodiment of the invention.

FIG. 7 is a schematic top view of an image-sensing display device according to an embodiment of the invention.

It is noted here that the element numerals and part of the content of the embodiment of FIG. 1A to FIG. 1C apply to the embodiment of FIG. 7, in which the same or similar numerals are used to represent the same or similar elements, and the description of the same technical content is omitted. Reference may be made to the foregoing embodiment for the description of the omitted part, which shall not be repeatedly described herein.

Referring to FIG. 7, an image-sensing display device 10e includes a substrate 100, a sensor unit 120a, a sensor unit 120b, a sensor unit 120c, a sensor unit 120d, a bank 110a, a bank 110b, a pixel control device 200a, and a pixel control device 200b.

The photo sensor L of the sensor unit 120a and the photo sensor L of the sensor unit 120b are located on the same bank 110a, and the photo sensor L of the sensor unit 120a and the photo sensor L of the sensor unit 120b share the same second electrode e2.

The photo sensor L of the sensor unit 120c and the photo sensor L of the sensor unit 120d are located on the same bank 110b, and the photo sensor L of the sensor unit 120c and the photo sensor L of the sensor unit 120d share the same second electrode e2.

The pixel control device 200a is located between the sensor unit 120a and the sensor unit 120c which are adjacent to each other. The pixel control device 200b is located between the sensor unit 120b and the sensor unit 120d which are adjacent to each other.

The photo sensors L and the pixel control device 200a or the pixel control device 200b are alternately arranged in a third direction Z3.

In some embodiments, the pixel control device 200a and the pixel control device 200b include a driving chip, a thin-film transistor, or another driving device.

By disposing the pixel control device 200a and the pixel control device 200b between the adjacent sensor units, the space utilization rate of the circuit layout can be increased. In addition, the pixel control device 200a and the pixel control device 200b are disposed in the display region, so that the image-sensing display device can exhibit the advantage of a narrow frame.

Figure 8:
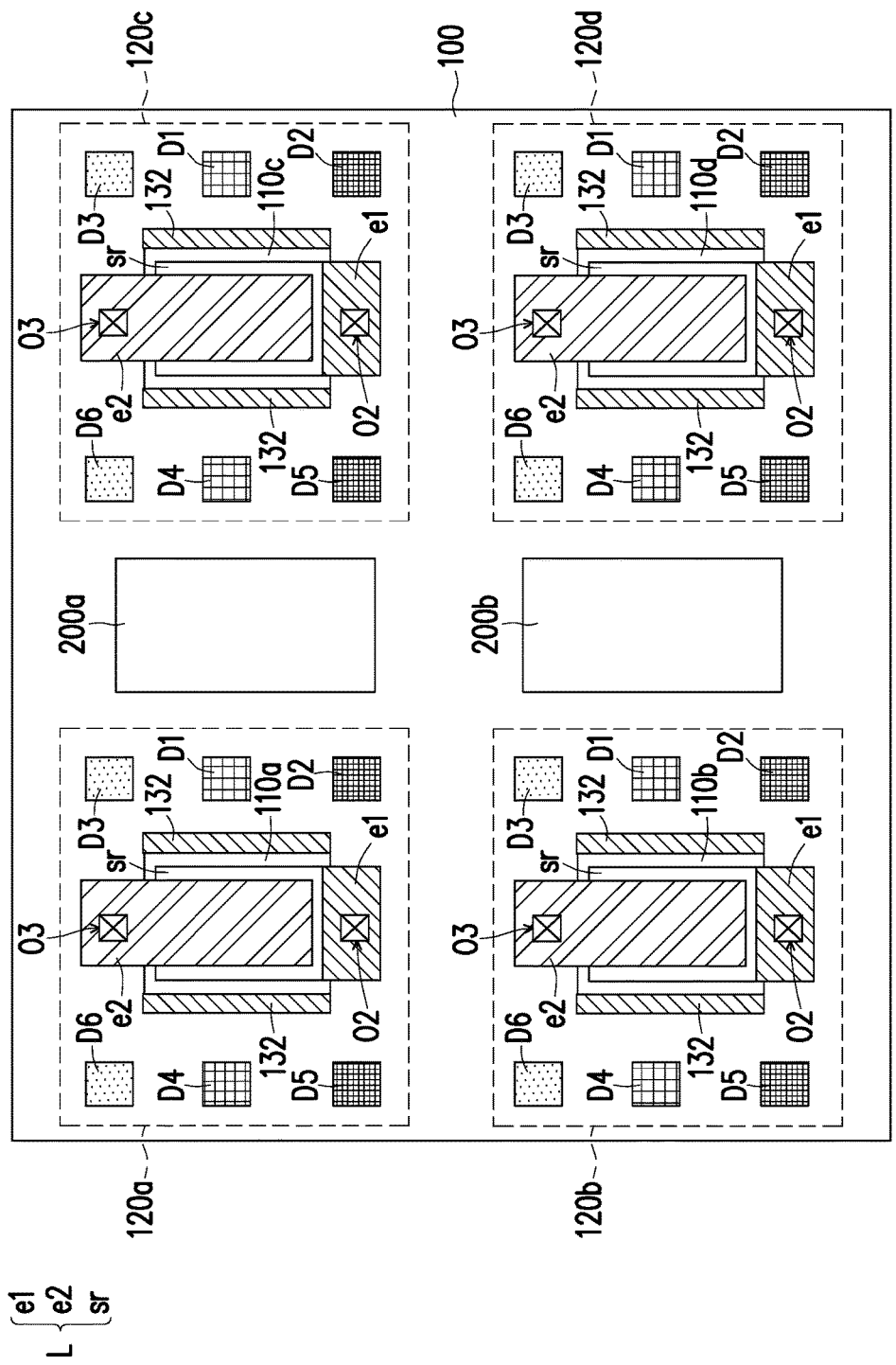
FIG. 8 is a schematic top view of an image-sensing display device according to an embodiment of the invention.

FIG. 8 is a schematic top view of an image-sensing display device according to an embodiment of the invention.

It is noted here that the element numerals and part of the content of the embodiment of FIG. 7 apply to the embodiment of FIG. 8, in which the same or similar numerals are used to represent the same or similar elements, and the description of the same technical content is omitted. Reference may be made to the foregoing embodiment for the description of the omitted part, which shall not be repeatedly described herein.

The main difference between an image-sensing display device 10f of FIG. 8 and the image-sensing display device 10e of FIG. 7 lies in that, in the image-sensing display device 10e, a plurality of sensor units are disposed corresponding to one bank, while in the image-sensing display device 10f, one sensor unit is disposed corresponding to one bank.

Referring to FIG. 8, the image-sensing display device 10f includes a substrate 100, a sensor unit 120a, a sensor unit 120b, a sensor unit 120c, and a sensor unit 120d, a bank 110a, a bank 110b, a bank 110c, a bank 110d, a pixel control device 200a, and a pixel control device 200b.

The photo sensor L of the sensor unit 120a is disposed on the bank 110a. The photo sensor L of the sensor unit 120c is disposed on the bank 110c. The two adjacent sensor units 120a and 120c respectively correspond to the two adjacent banks 110a and 110c, and the two adjacent banks 110a and 110c are separated from each other.

The photo sensor L of the sensor unit 120b is disposed on the bank 110b. The photo sensor L of the sensor unit 120d is disposed on the bank 110d. The two adjacent sensor units 120b and 120d respectively correspond to the two adjacent banks 110b and 110d, and the two adjacent banks 110b and 110d are separated from each other.

In the present embodiment, the banks 110a to 110d corresponding to the different sensor units 120a to 120d are separated from each other to thereby improve the issue of mutual interference between the adjacent sensor units 120a to 120d.

In summary of the above, in the image-sensing display device of the invention, the light emitted by the light-emitting device passes through fewer layers before reaching the sensing layer (at least not passing through the layers between the substrate and the bank). Therefore, the photo-current generated by the photo sensor can be better controlled and have better uniformity, and the issue of disuniform color or brightness (MURA) can be reduced.

Moreover, forming the photo sensor on the bank not only reduces the influence on the aperture ratio of pixels, but also prevents the photo sensor from being affected by other processes performed before the photo sensor is formed (e.g., the processes for forming the switch device and the active device).

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An image-sensing display device comprising:
a substrate;
a plurality of banks located on the substrate; and
a plurality of sensor units located on the substrate, each of the sensor units comprising:
a first light-emitting device, a second light-emitting device, a third light-emitting device, and a fourth light-emitting device located around a corresponding bank, wherein the first light-emitting device, the second light-emitting device, and the third light-emitting device comprise a red light-emitting device, a green light-emitting device, and a blue light-emitting device, and the first light-emitting device and the fourth light-emitting device are light-emitting devices of a same color; and
a photo sensor located on the corresponding bank, the photo sensor comprising: a first electrode, a second electrode, and a sensing layer located between the first electrode and the second electrode, wherein the first electrode and the second electrode respectively extend from the sensing layer along a first direction and a second direction, and the first direction is different from the second direction.

2. The image-sensing display device according to claim 1, further comprising a first reflection layer located on the corresponding bank, wherein the first reflection layer is separated from the first electrode and the second electrode.

3. The image-sensing display device according to claim 2, wherein the first light-emitting device is connected to a first connection structure and a second connection structure, and the first reflection layer and the first connection structure belong to a same patterned conductive layer.

4. The image-sensing display device according to claim 3, wherein the first light-emitting device is a vertical light-emitting device, and the first connection structure and the second connection structure are respectively connected to a lower side and an upper side of the first light-emitting device.

5. The image-sensing display device according to claim 4, wherein the first connection structure is a metal, and the second connection structure is a transparent conductive material.

6. The image-sensing display device according to claim 2, further comprising a second reflection layer located on another bank adjacent to the corresponding bank, wherein, compared to the second reflection layer, the first reflection layer is closer to the photo sensor, and a height of the first reflection layer is smaller than a height of the second reflection layer.

7. The image-sensing display device according to claim 1, wherein each of the sensor units further comprises an active device located below the corresponding bank.

8. The image-sensing display device according to claim 1, further comprising a pixel control device located between two adjacent sensor units.

9. The image-sensing display device according to claim 1, wherein two adjacent sensor units respectively correspond to two adjacent banks, and the two adjacent banks are separated from each other.

10. An image processing method comprising:
providing an image-sensing display device, the image-sensing display device comprising:
a substrate;
a plurality of banks located on the substrate; and
a plurality of sensor units located on the substrate, each of the sensor units comprising:
a first light-emitting device, a second light-emitting device, a third light-emitting device, and a fourth light-emitting device located around a corresponding bank, wherein the first light-emitting device, the second light-emitting device, and the third light-emitting device comprise a red light-emitting device, a green light-emitting device, and a blue light-emitting device, and the first light-emitting device and the fourth light-emitting device are light-emitting devices of a same color; and
a photo sensor located on the corresponding bank, the photo sensor comprising: a first electrode, a second electrode, and a sensing layer located between the first electrode and the second electrode, wherein the first electrode and the second electrode respectively extend from the sensing layer along a first direction and a second direction, and the first direction is different from the second direction;
scanning a sensed object, a method of scanning the sensed object comprising:
receiving, by the photo sensor, light of the first light-emitting device reflected by the sensed object;
receiving, by the photo sensor, light of the second light-emitting device reflected by the sensed object;
receiving, by the photo sensor, light of the third light-emitting device reflected by the sensed object; and
receiving, by the photo sensor, light of the fourth light-emitting device reflected by the sensed object;
computing a plurality of signals generated by the photo sensor; and
displaying an image generated after the signals are computed.

11. The method according to claim 10, wherein the method of scanning the sensed object further comprises:
receiving, by the photo sensor, light of the first light-emitting device reflected by the sensed object and generating a first signal;
storing the first signal;
receiving, by the photo sensor, light of the second light-emitting device reflected by the sensed object and generating a second signal;
storing the second signal;
receiving, by the photo sensor, light of the third light-emitting device reflected by the sensed object and generating a third signal;
storing the third signal;
receiving, by the photo sensor, light of the fourth light-emitting device reflected by the sensed object and generating a fourth signal;
storing the fourth signal;
computing the first signal, the second signal, the third signal, and the fourth signal; and
displaying an image generated after the first signal, the second signal, the third signal, and the fourth signal are computed.

12. The method according to claim 10, wherein the first light-emitting device and the fourth light-emitting device are turned on at a same time.

13. The method according to claim 10, wherein when the sensed object is scanned, the first light-emitting device, the second light-emitting device, the third light-emitting device, and the fourth light-emitting device are respectively driven at a frequency f1,
when the image generated after the signals are computed is displayed, at least a part of the first light-emitting device, the second light-emitting device, the third light-emitting device, and the fourth light-emitting device is driven at a frequency f2, and
the frequency f1 is greater than the frequency f2.

* * * * *